(12) United States Patent
Lucas et al.

(10) Patent No.: US 8,338,698 B2
(45) Date of Patent: Dec. 25, 2012

(54) ANISOTROPIC CONDUCTIVE LAYER AS A BACK CONTACT IN THIN FILM PHOTOVOLTAIC DEVICES

(75) Inventors: Tammy Jane Lucas, Lakewood, CO (US); Robert Dwayne Gossman, Aurora, CO (US); Scott Daniel Feldman-Peabody, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 228 days.

(21) Appl. No.: 12/870,055

(22) Filed: Aug. 27, 2010

(65) Prior Publication Data

US 2012/0024361 A1    Feb. 2, 2012

(51) Int. Cl.
    *H01L 31/00*    (2006.01)
(52) U.S. Cl. ......... 136/255; 136/256; 136/260; 136/264
(58) Field of Classification Search .................. 136/255, 136/256, 260, 264
    See application file for complete search history.

(56) References Cited

U.S. PATENT DOCUMENTS

| | | | |
|---|---|---|---|
| 4,042,534 A * | 8/1977 | Andrianov et al. | 252/511 |
| 5,001,302 A * | 3/1991 | Atsumi | 174/94 R |
| 5,181,968 A * | 1/1993 | Nath et al. | 136/256 |
| 6,332,786 B1 | 12/2001 | Suga et al. | |
| 6,344,370 B1 | 2/2002 | Izumi et al. | |
| 6,444,899 B2 | 9/2002 | Kubota et al. | |
| 6,858,461 B2 | 2/2005 | Oswald et al. | |
| 7,253,104 B2 | 8/2007 | Derderian et al. | |
| 7,259,321 B2 | 8/2007 | Oswald et al. | |
| 7,276,658 B2 | 10/2007 | Dubbeldam | |
| 2004/0112424 A1 | 6/2004 | Araki et al. | |
| 2007/0158804 A1 | 7/2007 | Hosoya et al. | |
| 2008/0230119 A1 * | 9/2008 | Akimoto | 136/255 |
| 2009/0194165 A1 | 8/2009 | Murphy et al. | |

FOREIGN PATENT DOCUMENTS

| | | |
|---|---|---|
| EP | 2014665 | 1/2009 |
| EP | 2124262 | 11/2009 |
| JP | 6318724 | 11/1994 |
| JP | 7094767 | 4/1995 |
| JP | 10173210 | 6/1998 |
| JP | 2002076398 | 3/2002 |
| JP | 2003174179 | 6/2003 |
| WO | WO 2007129097 A2 * | 11/2007 |

OTHER PUBLICATIONS

English Abstract of JP 2002076398, Published Mar. 15, 2002.
English Abstract of JP 10173210, Published Jun. 26, 1998.
English Abstract of JP 6318724, Published Nov. 15, 1994.
English Abstract of JP 2003174179, Published Jun. 20, 2003.
English Abstract of JP 7094767, Published Apr. 7, 1995.

* cited by examiner

*Primary Examiner* — Jennifer Michener
*Assistant Examiner* — Eli Mekhlin
(74) *Attorney, Agent, or Firm* — Dority & Manning, P.A.

(57) ABSTRACT

Thin film photovoltaic devices are generally provided. The device can include a transparent conductive oxide layer on a glass substrate, an n-type thin film layer on the transparent conductive layer, and a p-type thin film layer on the n-type layer. The n-type thin film layer and the p-type thin film layer form a p-n junction. An anisotropic conductive layer is applied on the p-type thin film layer, and includes a polymeric binder and a plurality of conductive particles. A metal contact layer can then be positioned on the anisotropic conductive layer.

17 Claims, 7 Drawing Sheets

ANISOTROPIC CONDUCTIVE LAYER AS A BACK CONTACT IN THIN FILM PHOTOVOLTAIC DEVICES

FIELD OF THE INVENTION

The subject matter disclosed herein relates generally to photovoltaic devices including an anisotropic conductive layer as a back contact or part of a back contact.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type layer, such as the cadmium telluride layer in a CdTe PV device.

However, metal electrodes can make a poor contact with the p-type layer, especially when the p-type layer includes cadmium telluride. This contact problem can lead to significantly reduced energy conversion efficiency in the device, and can lead to an increased rate of deterioration of the device.

Thus, a need exists for photovoltaic devices having improved energy conversion efficiency and/or device lifetime through improved contact between the back contact and the p-type layer, particularly when the p-type layer includes cadmium telluride.

BRIEF DESCRIPTION OF THE INVENTION

Aspects and advantages of the invention will be set forth in part in the following description, or may be obvious from the description, or may be learned through practice of the invention.

Thin film photovoltaic devices are generally provided. The device can include a transparent conductive oxide layer on a glass substrate, an n-type thin film layer on the transparent conductive layer, and a p-type thin film layer on the n-type layer. The n-type thin film layer and the p-type thin film layer form a p-n junction. An anisotropic conductive layer is applied on the p-type thin film layer, and includes a polymeric binder and a plurality of conductive particles. A metal contact layer can then be positioned on the anisotropic conductive layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
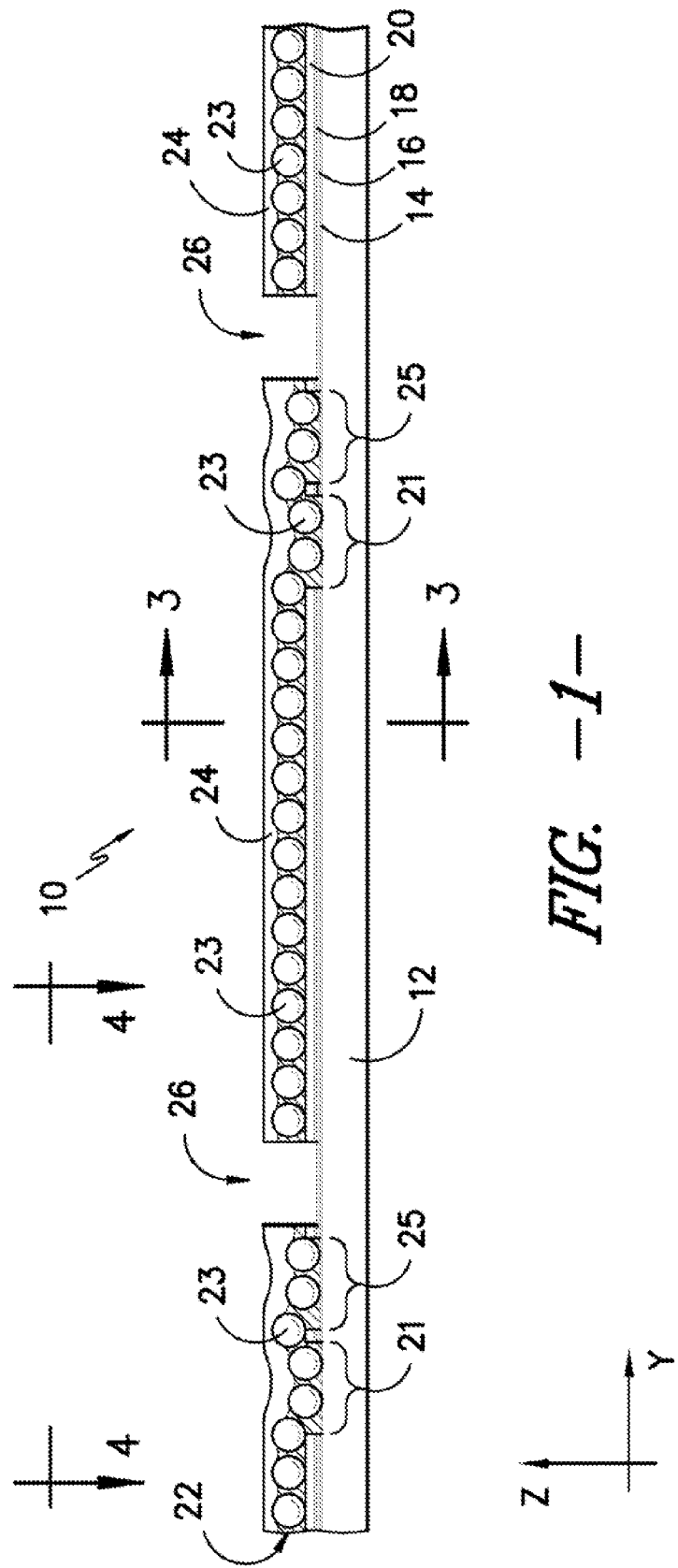
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

A thin film photovoltaic device is generally provided having an anisotropic conductive layer as the back contact or as part of the back contact. For example, the anisotropic conductive layer can be utilized between the p-n junction of the thin film PV device and a metal contact layer. In particular, the anisotropic conductive layer can be utilized between the p-type layer (e.g., a cadmium telluride layer) of the thin film PV device and the metal contact layer. For example, the thin film photovoltaic device can include a cadmium telluride layer as the p-type layer and directly contact the anisotropic conductive layer. In one embodiment, the anisotropic conductive layer can generally provide improved adhesion to and/or contact between a cadmium telluride thin film layer of a cadmium telluride based thin film PV device and the back electrical contact. Although the present disclosure is generally directed to cadmium telluride based thin film photovoltaic devices, it is to be understood that the anisotropic conductive layer can be utilized in any PV device as the back contact or as part of the back contact.

FIG. 1 shows a cross-section of an exemplary cadmium telluride based thin-film photovoltaic device 10. The device 10 is shown including a glass substrate 12, a transparent conductive oxide (TCO) layer 14, a resistive transparent buffer layer 16, a cadmium sulfide layer 18, a cadmium telluride layer 20, an anisotropic conductive layer 22 including a plurality of conductive particles 23, and a metal contact layer 24.

The anisotropic conductive layer 22 can be conductive through the thickness of the device 10 (i.e., conductive in the z-direction between the cadmium telluride layer 20 and the metal contact layer 24) but resistive in the plane of the device 10 (i.e., in the x-y plane of the anisotropic conductive layer 22). Thus, electrons can flow between the cadmium telluride layer 20 and the metal contact layer 24. However, the anisotropic conductive layer 22 can be resistive in the x-y plane, and can be utilized to separate the device 10 into individual cells. In one embodiment, the anisotropic conductive layer can have a resistance in the z direction of about 0.1 ohms to about 100 ohms, while having a resistance in both the x- and y-direction of greater than about 100 kohms.

The anisotropic conductive layer 22 can include a polymeric binder and a plurality of conductive particles 23. Although shown as substantially spherical in shape in FIG. 1, the conductive particles 23 can be any suitable shape. For instance, the conductive particles 23 can be metal beads (i.e., substantially solid metal beads), metal-plated glass beads, metal-plated polymeric beads, etc. The metal included in these conductive particles 23 can provide the conductive material to the anisotropic conductive layer 22. For example, the metal can comprise nickel, molybdenum, titanium, gold, silver, platinum, copper, tin, zinc, tungsten, or combinations or alloys thereof.

The polymeric binder generally provides a base material to hold the plurality of conductive particles 23 in the anisotropic conductive layer 22. Also, the polymeric binder can adhere the metal contact layer 24 to the cadmium telluride layer 20. In one particular embodiment, the polymeric binder is a chlorinated polymeric binder. The anisotropic conductive layer 22 can further include other materials, such as an inert filler material (e.g., silicone, clay, etc.), as well as solvents (e.g., dimethyl succinate, dimethyl glutarate, or mixtures thereof) and/or other processing aids. The polymeric binder can generally be an organic polymer (i.e., containing a carbon backbone) and act as an insulating material in the anisotropic conductive layer 22.

In one embodiment, the conductive particles 23 can have a size sufficient to traverse the thickness of the anisotropic conductive layer 22 (i.e., in the across the thickness of the layer in the z-direction). Thus, the conductive particles 23 can facilitate the movement of electrons between the cadmium telluride layer 20 and the metal contact layer 24 by providing a direct conductive connection between the cadmium telluride layer 20 and the metal contact layer 24. This direct conductive connection can reduce the resistance between the cadmium telluride layer 20 and the metal contact layer 24 to help increase the efficiency of the device 10.

For example, the conductive particles 23 can have an average diameter that is about equal to the thickness of the anisotropic conductive layer 22 (i.e., the average diameter of the conductive particles 23 is about 100% of the thickness of the anisotropic conductive layer 22) to about 50% greater than the thickness of the anisotropic conductive layer 22 (i.e., the average diameter of the conductive particles 23 is about 150% of the thickness of the anisotropic conductive layer 22). For instance, the conductive particles 23 can have an average diameter that is about 5% greater than the thickness of the anisotropic conductive layer 22 (i.e., the average diameter of the conductive particles 23 is about 105% of the thickness of the anisotropic conductive layer 22) to about 33% greater than the thickness of the anisotropic conductive layer 22 (i.e., the average diameter of the conductive particles 23 is about 133% of the thickness of the anisotropic conductive layer 22), such as about 10% greater than the thickness of the anisotropic conductive layer 22 (i.e., the average diameter of the conductive particles 23 is about 110% of the thickness of the anisotropic conductive layer 22) to about 25% greater than the thickness of the anisotropic conductive layer 22 (i.e., the average diameter of the conductive particles 23 is about 125% of the thickness of the anisotropic conductive layer 22).

The anisotropic conductive layer 22 can have, for instance, a thickness of about 2 micrometers (μm) to about 10 μm, such as about 4 μm to about 8 μm. The conductive particles 23 can have an average diameter of about 2 μm to about 20 μm, such as about 4 μm to about 12 μm. In one particular embodiment, the conductive particles 23 have an average diameter of about 4 μm to about 8 μm, while the anisotropic conductive layer 22 can have a thickness of about 4 μm to about 6 μm.

The photovoltaic device 10 generally includes a plurality of cells separated by scribe lines 21, 25, 26, which can generally be formed via a laser scribing process. For example, the laser scribing process can entail defining a first isolation scribe 21 through the photo reactive layers (i.e., the cadmium sulfide layer 18 and the cadmium telluride layer 20) and underlying layers (i.e., through the TCO layer 14) down to the glass substrate 12 prior to the application of the anisotropic conductive layer 22. The anisotropic conductive layer 22 can then be formed over the cadmium telluride 20 and in the first isolation scribe 21 by applying an anisotropic conductive paste. Thus, the first isolation scribe 21 can form part of the anisotropic conductive layer 22 and is filled with the polymeric binder and the conductive particles 23.

Since the anisotropic conductive layer 22 is conductive through the thickness of the device 10 (i.e., conductive in the z-direction between the cadmium telluride layer 20 and the metal contact layer 24) but resistive in the plane of the device (i.e., in the x-y plane of the anisotropic conductive layer 22), the anisotropic conductive layer 22 can provide a conductive back contact to the cadmium telluride layer 20 while isolating the individual cells via the first isolation scribe 21.

Figure 4:
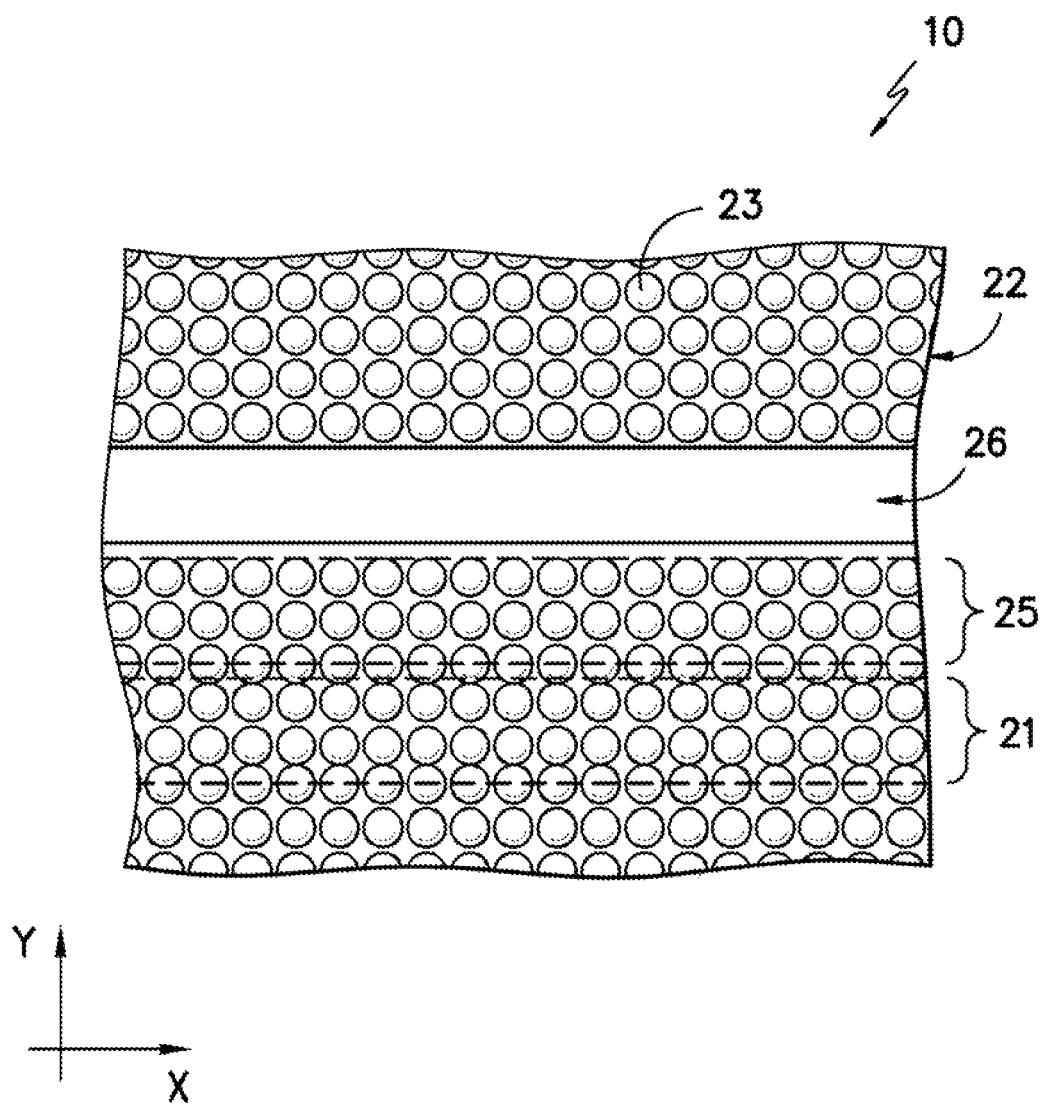
FIG. 4 shows a general schematic of a top view of the exemplary cadmium telluride thin film photovoltaic device of FIG. 1.

The resistance of the anisotropic conductive layer 22 in the plane of the device 10 stems from the manner in which the conductive particles 23 are positioned relative to each other in the anisotropic conductive layer 22. Since the conductivity of the anisotropic conductive layer 22 stems from the conductive particles 23, any break between adjacent conductive particles 23 in the plane of the device 10 will disrupt the conductivity of the anisotropic conductive layer 22 in the plane. Breaks between adjacent conductive particles 23 will undoubtedly occur during the formation of the anisotropic conductive layer 22 due to the relative sizes of the conductive particles 23 and the first isolation scribe. For example, the first isolation scribe 21 can have a width of about 50 µm to about 150 µm (e.g., about 75 µm to about 125 µm), and the conductive particles can have a diameter that is about 4 µm to about 8 µm. Thus, a plurality of conductive particles 23 can be positioned in the first isolation scribe 21 while not providing any electrical connection between adjacent cells due to the breaks between the conductive particles 23 positioned within the first isolation scribe 21. It is noted that although FIG. 1, the close-up view of FIG. 2, and the top view of FIG. 4 shows only two conductive particles 23 within the first isolation scribe 21, it is to be understood that the layers and scribes of FIG. 1 are not shown to scale, and many more conductive particles 23 may be present in the first isolation scribe 21. Thus, the inclusion of the anisotropic conductive layer 22 in the first isolation scribe 21 can provide a resistive barrier between the individually formed cells in device 10.

FIG. 4, for example, shows a top view of the device 10 of FIG. 1 prior to the application of the metal contact layer 24. As shown, breaks between adjacent conductive particles 23 occur in both the x- and y-directions of the layer. Thus, the conductivity of the anisotropic conductive layer 22 is generally non-existent and resistive in the plane of the device 10 (i.e., in the x-y plane of the anisotropic conductive layer 22).

Figure 2:
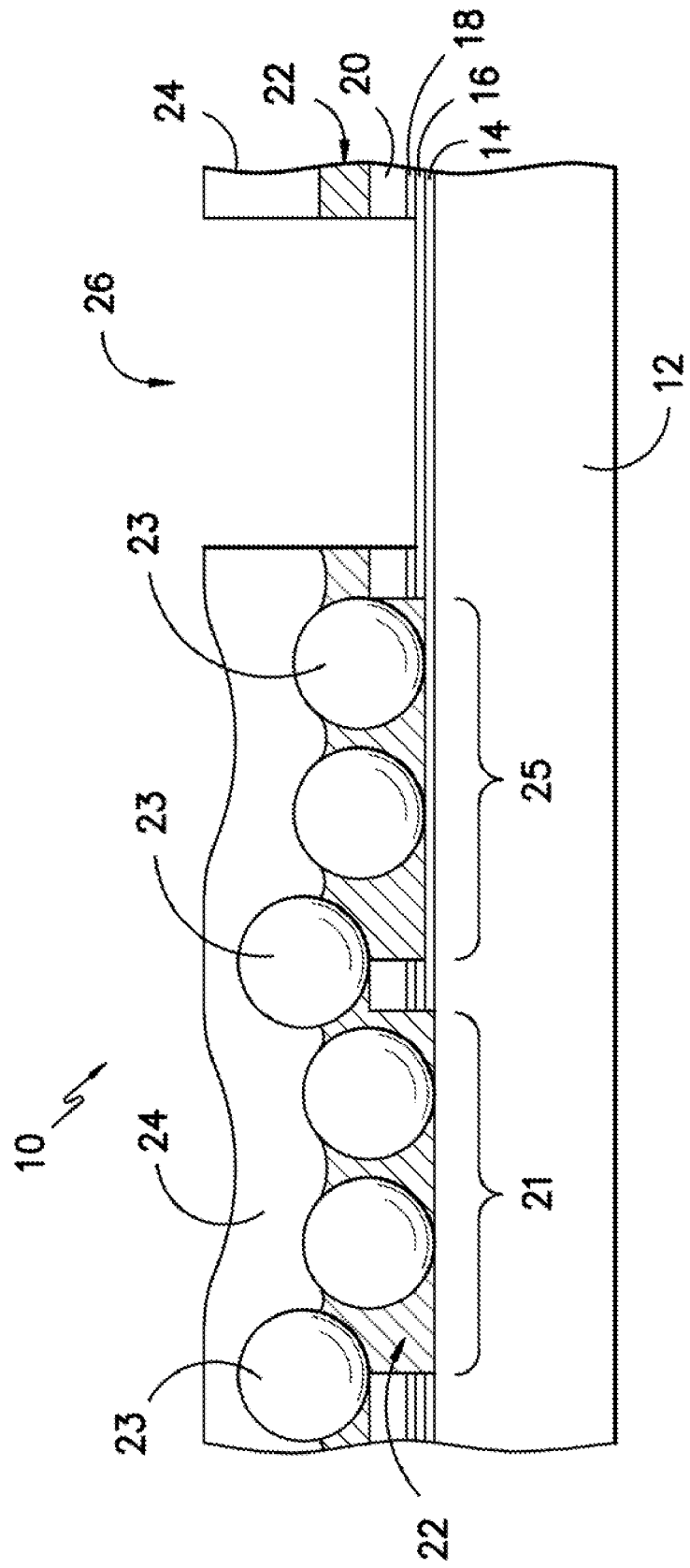
FIG. 2 shows a close-up view of the scribe section of the cross-sectional view of the exemplary cadmium telluride thin film photovoltaic device shown in FIG. 1.

The inclusion of the anisotropic conductive layer 22 can omit the step of filling the first isolation scribes 21 with a resistive material during the production of the device 10 in a typical manufacturing process. Thus, the device 10 can include the anisotropic conductive layer 22 in both the first isolation scribe 21 and the series connecting scribe 25, as shown in FIG. 2. This omission of this processing step can significantly reduce the processing difficulty, materials used, etc., which can lead to lower manufacturing costs.

However, if desired, the first isolation scribe 21 can be filled with dielectric material before application of the anisotropic conductive layer 22 in order to ensure that the TCO layer 14 is electrically isolated between cells. For example, the first isolation scribe 21 can be filled using a photoresist development process wherein a liquid negative photoresist (NPR) material is coated onto the cadmium telluride layer 20 by spraying, roll coating, screen printing, or any other suitable application process. The substrate 12 is then exposed to light from below such that the NPR material in the first isolation scribes 21 (and any pinholes in the cadmium telluride material 20) are exposed to the light, causing the exposed NPR polymers to crosslink and "harden." The substrate 12 is then "developed" in a process wherein a chemical developer is applied to the cadmium telluride layer 20 to dissolve any unhardened NPR material. In other words, the NPR material that was not exposed to the light is washed away from the cadmium telluride layer 20 by the developer, leaving the first isolation scribes 21 filled with the NPR material. Then, the anisotropic conductive layer 22 can then be applied over the cadmium telluride layer 20 and the first isolation scribes 21 filled with the NPR material.

As shown in the close-up view of FIG. 2, the anisotropic conductive layer 22 can also fill in the series connecting scribe 25 similar to the first isolation scribe 21 to electrically connect adjacent cells to each other in series. Specifically, the series connecting scribe 25 can form part of the anisotropic conductive layer 22 to contact the TCO layer 14 providing a direct electrical connection between the back contact (i.e., the metal contact layer 24) and the front contact material (i.e., the TCO layer 14) through the conductive particles 23. This configuration is allowed due to the resistance of the anisotropic conductive layer 22 in the plane of the device, while being conductive through the thickness of the layers.

Finally, a second isolation scribe 26 can be laser cut through the back contact (i.e., the anisotropic conductive layer 22 and the metal contact layer 24) and photo reactive layers (i.e., the cadmium sulfide layer 18 and the cadmium telluride layer 20) to isolate the back contact into individual cells.

Figure 5:
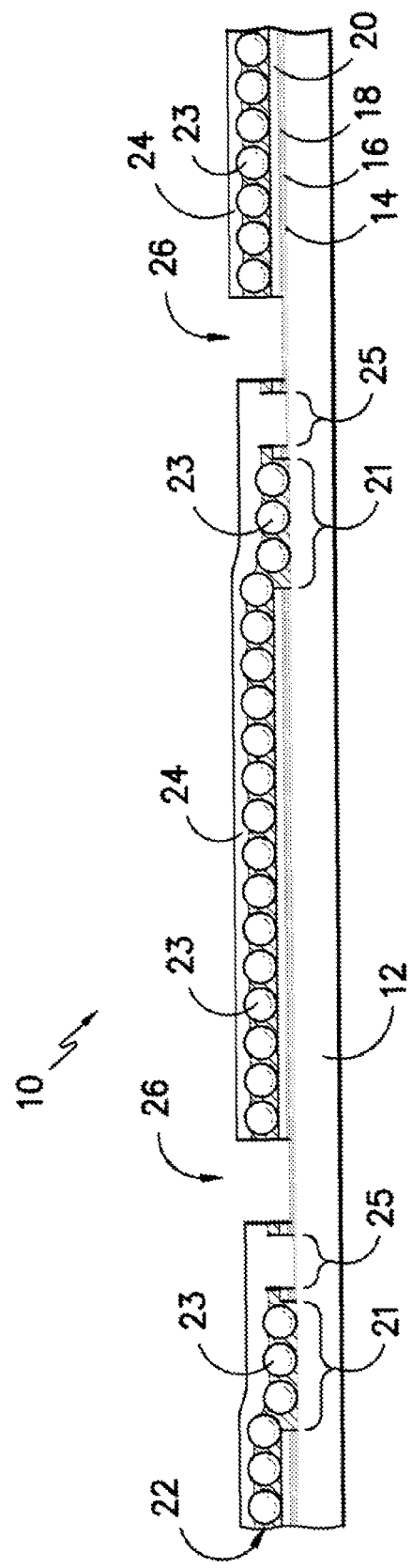
FIG. 5 shows a general schematic of a cross-sectional view of another exemplary cadmium telluride thin film photovoltaic device according to another embodiment of the present invention.
Figure 6:
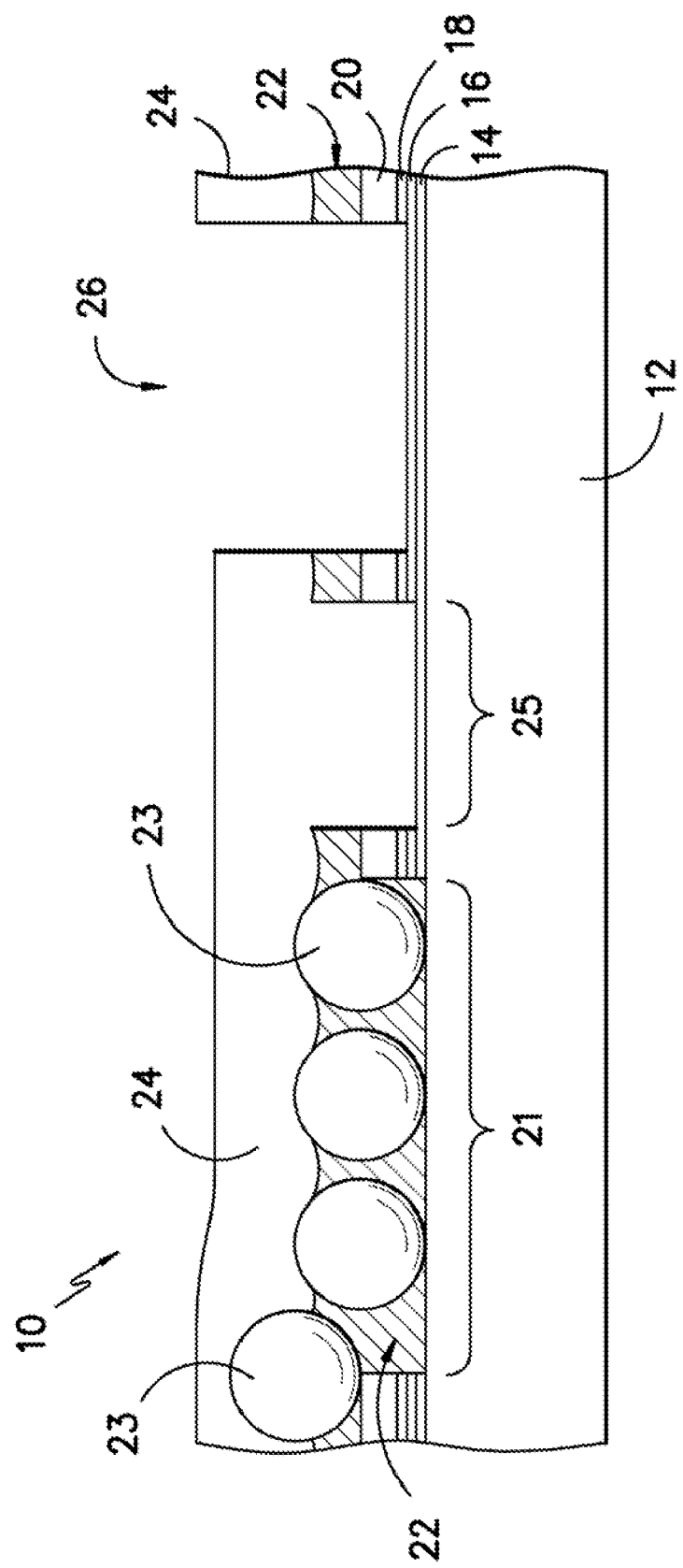
FIG. 6 shows a close-up view of the scribe section of the cross-sectional view of the exemplary cadmium telluride thin film photovoltaic device shown in FIG. 4.

In the alternative embodiment shown in FIG. 4 and the close-up view of FIG. 5, after forming the anisotropic conductive layer 22, the series connecting scribe 25 can be laser cut through the anisotropic conductive layer 22 to the TCO layer 14 and filled with the conductive metallic material of the metal contact layer 24 to electrically connect adjacent cells to each other in series. Of course, any conductive material can be included in the series connecting scribes 25. Specifically, the series connecting scribe 25 can form part of the metal contact layer 24 to contact the TCO layer 14 providing a direct electrical connection between the back contact (i.e., the anisotropic conductive layer 22 and the metal contact layer 24) and the front contact material (i.e., the TCO layer 14).

The anisotropic conductive paste can be applied to the device 10 by any suitable method for spreading the blend or paste, such as screen printing, spraying or by a "doctor" blade. After the application of the anisotropic conductive paste to the cadmium telluride layer 20 defining the first isolation scribe 21, the device 10 can be heated to convert the anisotropic conductive paste into the anisotropic conductive layer 22. For example, the anisotropic conductive paste can be heated to cure the polymeric binder at a curing temperature of about 100° C. to about 300° C. Curing the anisotropic conductive paste can evaporate any solvent present in the as deposited anisotropic conductive paste and/or crosslink the polymeric binder to secure and/or bond the anisotropic conductive layer 22 on the cadmium telluride layer 20.

Figure 3:
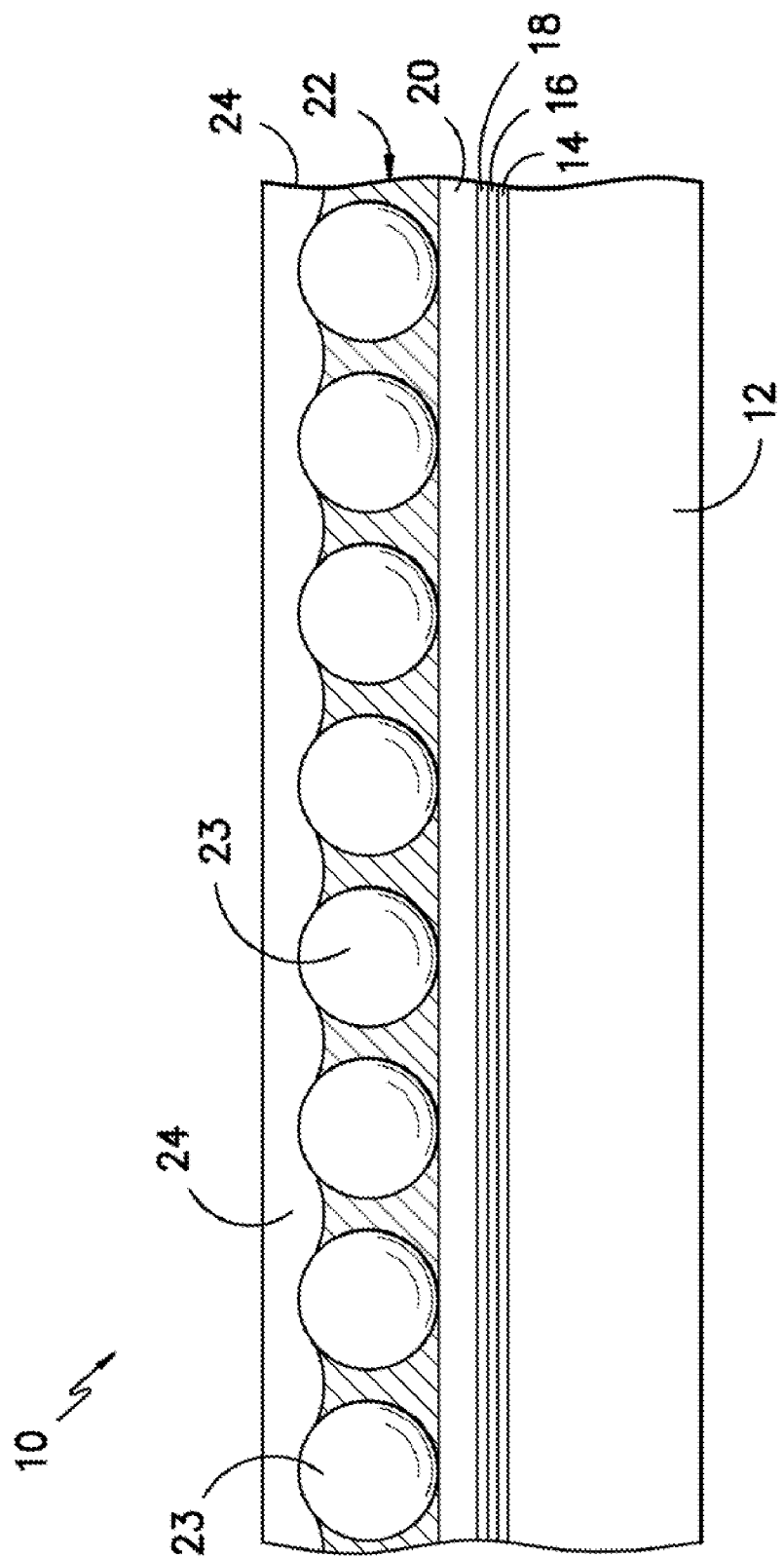
FIG. 3 shows a general schematic of a cross-sectional view, perpendicular to that shown in FIG. 1, of the exemplary cadmium telluride thin film photovoltaic device of FIG. 1.

The anisotropic conductive layer 22 can be used in any cadmium telluride thin film photovoltaic device 10. FIG. 3 shows another cross-section of the device 10 that is perpendicular to the cross-sectional view shown in FIG. 1 or FIG. 2, and depicts a close-up view of the several photovoltaic layers in the device 10. The exemplary devices 10 of FIGS. 1-5 include a top sheet of glass 12 employed as the substrate. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

The transparent conductive oxide (TCO) layer 14 is shown on the glass 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pyrolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The cadmium sulfide layer 18 is shown on resistive transparent buffer layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 µm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 µm reduces any adsorption of radiation energy by the cadmium sulfide layer 18, effectively increasing the amount of radiation energy reaching the underlying cadmium telluride layer 22.

The cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layers, particularly the anisotropic conductive layer 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride.

Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact is formed from the anisotropic conductive layer 22 and the metal contact layer 24 shown on the cadmium telluride layer 20 and generally serves as the back electrical contact, in relation to the opposite, TCO layer 14 serving as the front electrical contact. The back contact is formed on, and in one embodiment is in direct contact with, the cadmium telluride layer 20.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells, as described above with respect to FIG. 1.

Figure 7:
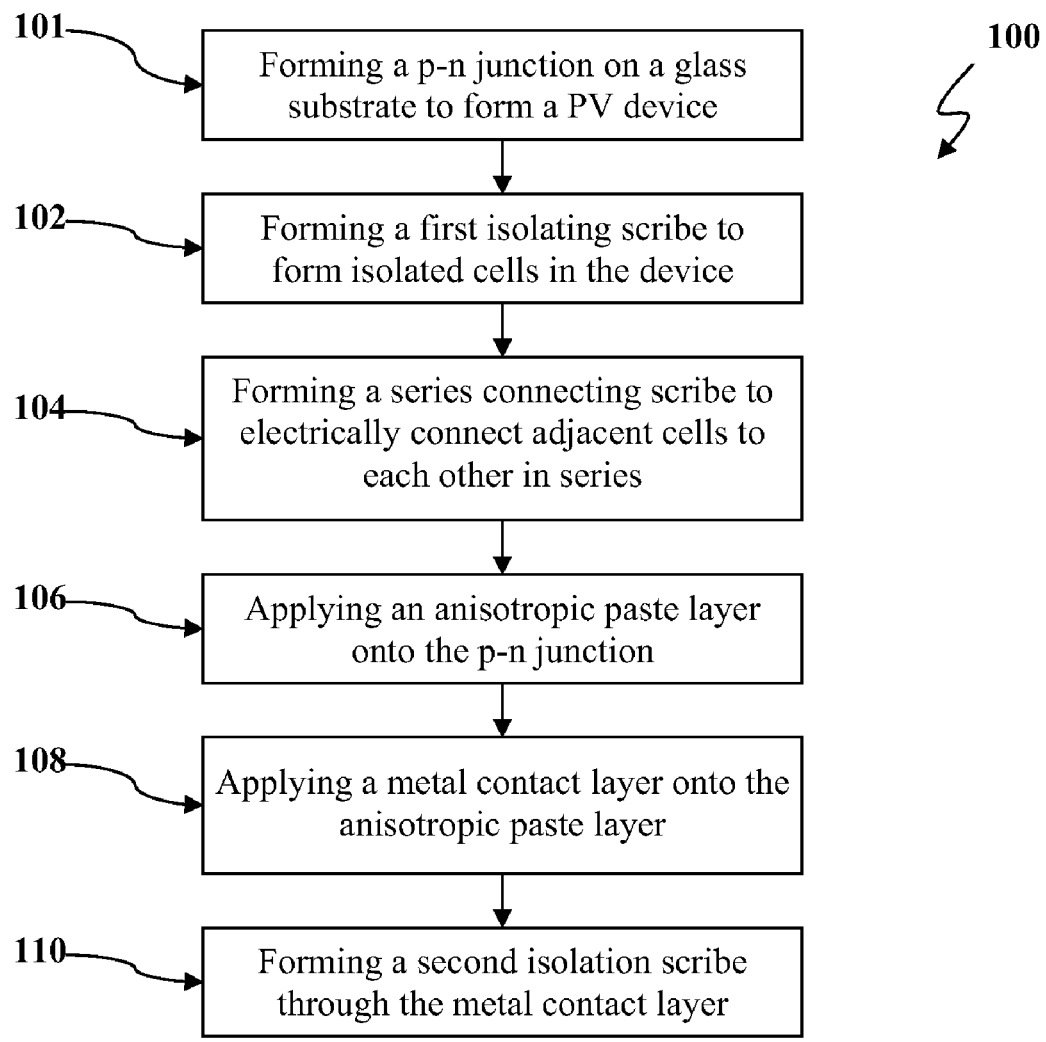
FIG. 7 shows a flow diagram of an exemplary method of applying an anisotropic conductive layer to a photovoltaic device.

Methods for forming a photovoltaic device are also generally provided. FIG. 7 shows an exemplary method 100. At 101, a p-n junction on a glass substrate is formed to produce a PV device. For instance, the p-n junction can be formed from a cadmium telluride thin film layer and a cadmium sulfide thin film layer. A first isolating scribe can then be formed in the device at 102, and a series connecting scribe can be formed to electrically connect adjacent cells to each other in series at 104. An anisotropic conductive layer can be applied onto the p-n junction (e.g., filing the first isolating scribe and, optionally, the series connecting scribe) at 106. A metal contact layer can be applied to the anisotropic conductive layer at 108, and a second isolation scribe can be formed through the metal contact layer at 110.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A thin film photovoltaic device, comprising:
    a glass substrate;
    a transparent conductive oxide layer on the glass substrate;
    an n-type thin film layer on the transparent conductive layer;
    a p-type thin film layer on the n-type layer, wherein the n-type thin film layer and the p-type thin film layer form a p-n junction;
    an anisotropic conductive layer on the p-type thin film layer, wherein the anisotropic conductive layer comprises a polymeric binder and a plurality of conductive particles; and,
    a metal contact layer on the anisotropic conductive layer, wherein a first isolation scribe extends through the p-type thin film layer to the glass substrate to form isolated cells in the device, wherein the first isolation scribe forms part of the anisotropic conductive layer and is filled with the polymeric binder and the conductive particles.

2. The device of claim 1, wherein the conductive particles have a size sufficient to traverse the anisotropic conductive layer to provide a direct conductive connection between the p-type layer and the metal contact layer.

3. The device of claim 1, wherein the anisotropic layer defines a thickness, and wherein the conductive particles have an average diameter that is about equal to the thickness of the anisotropic conductive layer to about 50% greater than the thickness of the anisotropic conductive layer.

4. The device of claim 1, wherein the conductive particles have an average diameter of about 4 μm to about 8 μm, and wherein the anisotropic conductive layer has a thickness of about 4 μm to about 6 μm.

5. The device of claim 1, wherein the conductive particles comprise metal-plated glass beads, metal particles, metal-plated polymeric beads, or combinations thereof.

6. The device of claim 1, wherein the anisotropic conductive layer further comprises an inert filler material.

7. The device of claim 1, wherein the anisotropic conductive layer has a resistance in a z-direction extending from the p-type layer to the metal contact layer of about 0.1 ohms to about 100 ohms, and wherein the anisotropic conductive layer has a resistance in a direction perpendicular to the z-direction of greater than about 100 kohms.

8. The device of claim 1, wherein the n-type thin film layer comprises cadmium sulfide, and wherein the p-type thin film layer comprises cadmium telluride.

9. The device of claim 8, further comprising:
    a resistive transparent buffer layer between the transparent conductive oxide layer and the n-type thin film layer.

10. The device of claim 1, wherein at least two adjacent individual conductive particles positioned within the first isolation scribe define a break therebetween to disrupt electrical flow through a plane defined by the anisotropic conductive layer.

11. The device of claim 1, wherein the first isolation scribe has a width of about 50 μm to about 150 μm, and wherein the conductive particles have a diameter that is about 4 μm to about 8 μm.

12. The device of claim 11, wherein the first isolation scribe has a width of about 75 μm to about 125 μm.

13. The device of claim 1, further comprising:
    a series connecting scribe forming part of the anisotropic conductive layer to contact the transparent conductive oxide layer to electrically connect adjacent cells to each other in series; and,
    a second isolation scribe through the metal contact layer, the anisotropic conductive layer, the p-type thin film layer, and the n-type thin film layer.

14. The device of claim 1, further comprising:
    a series connecting scribe through the anisotropic conductive layer to the transparent conductive oxide layer, wherein the series connecting scribe forms part of the metal contact layer to electrically connect adjacent cells to each other in series; and,
    a second isolation scribe through the metal contact layer, the anisotropic conductive layer, the p-type thin film layer, and the n-type thin film layer.

15. A thin film photovoltaic device, comprising:
    a glass substrate;
    a transparent conductive oxide layer on the glass substrate;
    a resistive transparent buffer layer on the transparent conductive oxide layer;
    a cadmium sulfide thin film layer on the resistive transparent buffer layer;
    a cadmium telluride thin film layer on the cadmium sulfide thin film layer;
    an anisotropic conductive layer on the cadmium telluride thin film layer, wherein the anisotropic conductive layer comprises a polymeric binder and a plurality of conductive particles, wherein the anisotropic conductive layer has a resistance in a z-direction extending from the p-type layer to the metal contact layer of about 0.1 ohms to about 100 ohms, and wherein the anisotropic conductive layer has a resistance in a direction perpendicular to the z-direction of greater than about 100 kohms; and, a metal contact layer on the anisotropic conductive layer, wherein a first isolation scribe extends through the p-type thin film layer to the glass substrate to form isolated cells in the device, wherein the first isolation scribe forms part of the anisotropic conductive layer and is filled with the polymeric binder and the conductive particles.

16. The device of claim 15, wherein the conductive particles have a size sufficient to traverse the anisotropic conductive layer to provide a direct conductive connection between the cadmium telluride thin film layer and the metal contact layer.

17. The device of claim 15, further comprising:
a series connecting scribe forming part of the anisotropic conductive layer to contact the transparent conductive oxide layer to electrically connect adjacent cells to each other in series; and,
a second isolation scribe through the metal contact layer, the anisotropic conductive layer, the cadmium telluride thin film layer, and the cadmium sulfide thin film layer.

* * * * *